United States Patent [19]
Benedetto et al.

[11] Patent Number: 4,901,013
[45] Date of Patent: Feb. 13, 1990

[54] APPARATUS HAVING A BUCKLING BEAM PROBE ASSEMBLY

[75] Inventors: William E. Benedetto, Succasunna; Joseph M. Moran, Berkeley Heights, both of N.J.

[73] Assignee: American Telephone and Telegraph Company, AT&T Bell Laboratories, Murray Hill, N.J.

[21] Appl. No.: 233,777

[22] Filed: Aug. 19, 1988

[51] Int. Cl.$^4$ .............................................. G01R 31/02
[52] U.S. Cl. ............................ 324/158 F; 324/158 P; 324/73.1
[58] Field of Search .............. 324/72.5, 73 PC, 158 F, 324/158 P

[56] References Cited

U.S. PATENT DOCUMENTS

| | | | |
|---|---|---|---|
| 3,806,801 | 4/1974 | Bove | 324/72.5 |
| 3,824,462 | 7/1974 | Vinsani | 324/158 F |
| 4,506,215 | 3/1985 | Coughlin | 324/158 P |
| 4,518,910 | 5/1985 | Hottenrott et al. | 324/158 P |
| 4,622,514 | 11/1986 | Lewis | 324/158 P |
| 4,686,464 | 8/1987 | Elsasser et al. | 324/158 P |
| 4,686,467 | 8/1987 | DeLapp et al. | 324/158 FX |

OTHER PUBLICATIONS

*IBM Technical Disclosure Bulletin*, vol. 18, No. 4, Sep. 1975, "Floating Bias Plate for Buckling Column Contactor", by E. J. Dombroski et al., pp. 1038–1039.
*IBM Technical Disclosure Bulletin*, vol. 19, No. 4, Sep. 1976, "Contact Probe Assembly with a Retractable Shorting Center", by L. H. Faure, pp. 1267–1268.
*IBM Technical Disclosure Bulletin*, vol. 15, No. 10, Mar. 1973, "Buckling Wire Probe Assembly", by L. D. Lipschutz et al., pp. 3032–3034.
*IBM Technical Disclosure Bulletin*, vol. 15, No. 10, Mar. 1973, "High-Density Contactors to Electrical Space Transformers", by A. Kostenko, Jr., p. 3035.
*IBM Technical Disclosure Bulletin*, vol. 15, No. 11, Apr. 1973, "Buckling Direction Control in High-Density Contactors", by A. Kostenko, Jr., p. 3543.

*Primary Examiner*—Reinhard J. Eisenzopf
*Assistant Examiner*—Vinh P. Nguyen
*Attorney, Agent, or Firm*—Eugen E. Pacher

[57] ABSTRACT

An apparatus for testing of electrical circuits has a buckling beam probe assembly having advantageous features that make it useful for contacting area arrays of test points, and for reliably establishing contact therewith. The probe elements remain essentially parallel even in the buckled state, and the probe tips execute a small "wiping" movement on the contact point. In some preferred embodiments the probe tips are shaped to result in reduced contact area.

6 Claims, 3 Drawing Sheets

APPARATUS HAVING A BUCKLING BEAM PROBE ASSEMBLY

FIELD OF THE INVENTION

This invention pertains to the field of apparatus for testing of electrical circuits.

BACKGROUND OF THE INVENTION

In recent years the complexity of electrical circuits has reached a point such that the number of input and output pads frequently is too large to be accommodated on the periphery of an electronic chip or interconnect substrate. Furthermore, the number of input and output pads can easily be in excess of what can conveniently be handled by means of prior art cantilever probes.

In order to overcome the limitations of the cantilever probe technique, so-called "buckling beam" probes have been developed. See U.S. Pat. No. 3,806,801, which discloses a high density, constant force probe assembly utilizing buckling wires.

Numerous variations on the basic buckling beam probe are also known to the art. For instance, U.S. Pat. No. 4,506,215 discloses an assembly that uses a centerpost and guide plates to align the beams, with pre-bow induced in the beams. The patent also discloses the presence in the assembly of guidepins that are angled relative to the buckling beams to induce a wiping action of the buckling beams on the test points when a load is applied to buckling beams contacting the circuit test points.

U.S. Pat. No. 4,518,910 discloses a buckling beam assembly that comprises a central post comprising a spring-loaded plunger and a nut and bolt arrangement that permits resurfacing of the contact tips to insure longer life for the buckling beams. Other variations are disclosed, for instance, in U.S. Pat. Nos. 4,622,514 and 4,686,464, with the latter disclosing a buckling beam probe assembly comprising a number of sub-assemblies, each of which has a multiplicity of buckling beams arranged in an area array form. See also, for instance, E. J. Dombroski, et al, IBM Technical Disclosure Bulletin, Vol. 18 (4), pp. 1038–1039; L. H. Faure, op. cit., Vol. 19 (4), pp. 1267–1268; L. D. Lipschutz, et al, op. cit., Vol. 15 (10), pp. 3032–3034; A. Kostenko, op. cit., Vol. 15 (10), page 3035; and A. Kostenko, op. cit., Vol. 15 (11), page 3543.

Although the prior art knows a number of buckling beam probe assemblies there still exists a need for a simple and convenient assembly that can accommodate an area array of probes, that potentially can accommodate hundreds of probes, wherein the probes exert substantially identical contact force on the respective test pads, and which optionally is adapted for probe tip repair and/or for direct optical monitoring of placement of the probe array onto the array of test points, and which optionally can accommodate bare probe wires. This application discloses such an assembly.

SUMMARY OF THE INVENTION

The inventive apparatus for testing an electrical circuit (or circuits) comprises a probe assembly that comprises first and second guide elements, spacer means, a multiplicity of buckling beam probe elements, and means for applying (or deriving) an electrical signal to (from) at least one (typically a multiplicity) of the probe elements.

The circuit to be tested has an array of test points on an essentially planar substrate, and each of the guide elements has a multiplicity of through-holes that form an array that corresponds to the array of test points. The spacer means serve to maintain the second guide element spaced apart from, and in fixed relationship with, the first guide element, the spacer means being arranged such that the interior portion of the first guide element is substantially unobstructed, i.e., such that the array of holes can be located at or near the central portion of the guide element. Any given probe element is attached to, and extends into or through one of the holes in, the second guide element, also extends through one of the holes in the first guide element and a small distance beyond, and is essentially parallel with the other probe elements. The array of holes in the first guide element is laterally offset with respect to the array in the second guide element, whereby a predetermined buckling direction is imposed on the probe elements.

The probe assembly typically comprises features that result in some lateral motion of the tip of any given probe element when the probe element is urged against a test point. Such lateral motion increases the likelihood that good electrical contact will be established between the probe element and the test point. Exemplarily, the diameter of the holes in the first guide element is larger than the diameter of the probe element extending through the hole by an amount that results in lateral motion of the probe tip of between 0.01 and 0.03 mm for the particular geometry of the probe assembly.

In a particular embodiment of the inventive apparatus the second guide element is silicon or other appropriate material (e.g., PC-board with metalization and drilled holes) plate-like body. The remainder of the discussion is addressed to a Si element. The extension to other materials is considered to be within the skill of the art. The through-holes are preferably formed by photolithography and anisotropic etching, the probe elements are attached to the silicon body by solder vapor phase reflow or any other appropriate known attachment technique, photolithography and etching are used to form conductive paths on the surface of the silicon body with a given path connecting a given probe element to a contact point typically at the periphery of the silicon body. This embodiment can, due to the narrowness of conductor lines that can be achieved with ease on a silicon chip, considerably simplify the fan-out of the conductor lines, as compared to embodiments that use, e.g., PC-board technology.

DETAILED DESCRIPTION OF SOME PREFERRED EMBODIMENT

Figure 1:
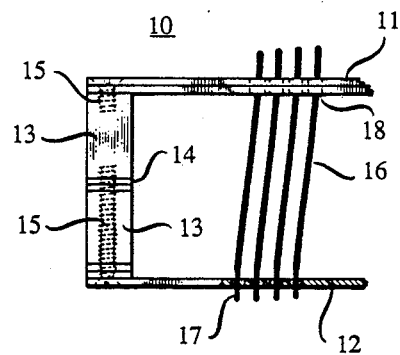
FIGS. 1 and 2 schematically depict exemplary embodiments of the inventive probe assembly (only a portion of each assembly is shown)

The inventive apparatus comprises a buckling beam unit, an exemplary embodiment (10) of which is schematically depicted in FIG. 1. The unit comprises a first guide element 12, a second guide element 11, spacer means 13, and a multiplicity of buckling beam probe elements 16. Guide elements 11 and 12 have identical through-hole patterns, typically forming a space array (by a "space array" we mean a two-dimensional pattern of holes, as opposed to an essentially one-dimensional linear array). It will be appreciated that FIG. 1 only shows a portion of the exemplary buckling beam unit, and that actual units typically comprise many dozens and even several hundreds of probe elements.

The guide elements 12 and 11 can consist of any appropriate material, e.g., a polymeric material such as DELRIN, or of a more or less transparent material such as acrylic. The probe wires exemplarily are covered with a known electrical insulator, with only a short length 17 of the wires being bare, and are secured to the second guide element (and free to move longitudionally relative to the first guide element), exemplarily by means of adhesive 18. The spacer means optionally comprise means that permit reduction of the spacing between guide elements 11 and 12, exemplarily thin spacers 14 made from conventional shim stock. The buckling beam unit is held together by appropriate means (e.g., screws 15) such that the guide elements are maintained in fixed relationship relative to each other. Guide element 11 is shown to consist of two substantially identical thin plates. Such an arrangement facilitates adhesive attachment of the fibers 16 to the guiding element.

Exemplarily, the guide element 12 consists of a 0.75 mm thick acrylic plate, guide element 11 consists of two such plates, the spacer means 13 are about 10–20 mm high, the probe elements are 0.090 mm BeCu wires, the insulation is urethane acrylate (0.012 mm wall thickness) and the probe elements extend approximately 0.50–0.75 mm beyond the first guiding element 12. The hole pattern in the first guide element is offset by about 1–2 mm with regard to the hole pattern in the second guide element.

As indicated in FIG. 1, the probe elements in 10 are essentially parallel with each other. If the probe assembly is placed over an electric circuit comprising a multiplicity of appropriately arranged test points such that the tips of the probe elements contact the test pads, and if a force of appropriate magnitude is applied to the probe assembly in a direction normal to the circuit-carrying substrate then the probe elements will buckle, whereby the extension of the probe elements beyond the lower guide plate is reduced. The buckled probe elements typically will still be substantially parallel with each other.

Figure 2:
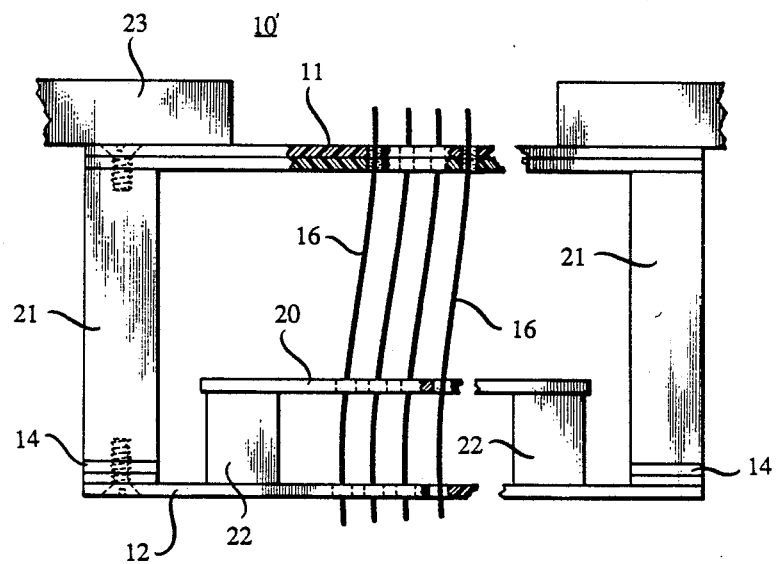

A further exemplary embodiment of a probe unit according to the invention is depicted schematically in FIG. 2. The probe unit 10' differs from the above-described probe unit 10 primarily in the presence of a third guide element 20 which is freely movable in a lateral direction, and which optionally is appropriately supported in the axial direction. Exemplarily, such support is provided by support blocks 22 which rest on guide element 12. The third guide element 20 serves to maintain parallelity between the buckling beams 16, thereby reducing the possibility of contact between beams. Thus it will frequently be possible to use bare (uninsulated) probe elements, which can result in cost savings. It will be noted that the possibility of using bare probe elements is not necessarily limited to buckling beam units comprising a third guide element. It will be appreciated that more than one floating guide element can be present in a buckling beam unit according to the invention, whereby the likelihood of shorting between bare probe wires can be further decreased. Ways to maintain a multiplicity of floating guide plates in spaced apart relationship will be readily apparent to those skilled in the art, e.g., supports attached to spacer means 21.

It has been frequently found advantageous to incorporate features into the inventive assembly that result in a small amount of lateral motion of any given probe tip when the tip is in contact with a test pad and the probe elements are appropriately loaded. Such lateral motion assists in the penetration of the probe tip through a surface oxide layer or other insulating layer that may be present on test pads.

A simple feature that will result in the desired lateral motion is the appropriate choice of hole diameter in the first guide element. Exemplarily, it has been found that 0.0175 mm lateral motion of the probe tip results if the first guide plate is 0.75 mm thick, the probe tip protrudes 0.75 mm beyond the first guideplate, the hole in the guideplate has a diameter of 0.11 mm, and the bare probe wire is 0.090 mm in diameter. In general it is believed that 0.005 to 0.05 mm lateral motion will be sufficient to substantially increase the probability of establishing good contact between probe tip and test pad, although motions outside of this range may also be useful. The lower useful limit on lateral motion typically is established by the amount of motion required to break through an insulator layer that may be present on the test pad, whereas the upper limit typically is determined by the size of the test pad and is chosen such that the lateral movement is unlikely to result in movement of the probe point off the test pad. Selection of the appropriate guidehole diameter is a matter of simple geometry, as will be appreciated by those skilled in the art, and therefore does not require detailed discussion.

Apparatus according to the invention typically comprises means for making electrical contact with the appropriate probe wires, and means that facilitate appropriate placement of the probe tips, and application of the appropriate force to the probe wires such that electrical contact between a test pad and the associated probe wire will be reliably established. Exemplarily, the unit 10' is attached (e.g., by adhesive means) to a support plate 23 (e.g., a PC board) which has a central opening which facilitates direct optical alignment of the probe tips and through which the probe wires can be routed. The support plate in turn can be secured to appropriate support means, e.g., a commercially available circuit board that is compatible with a standard testing machine.

Figure 3:
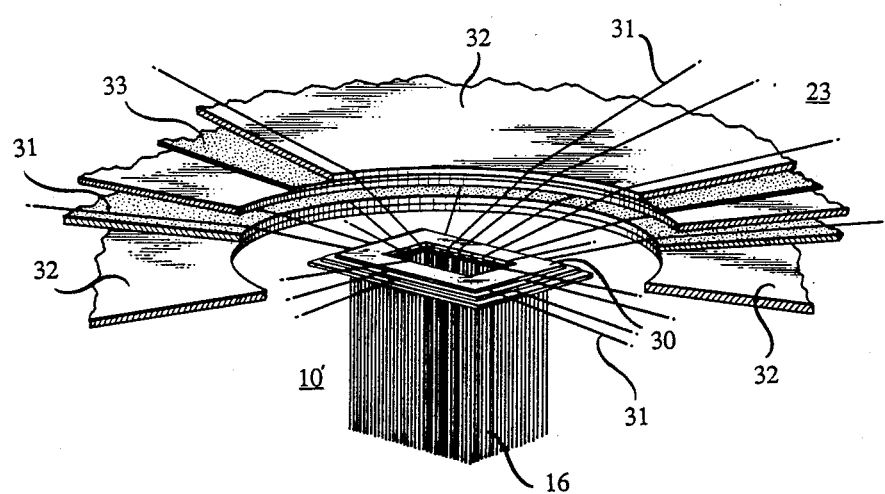
FIGS. 3 and 6 schematically depict part of exemplary test apparatus comprising a probe assembly according to the invention.

In many embodiments of the instant invention the number and density of probe wires is high, such that attention has to be paid to proper fan-out. An exemplary approach to achieving such fan-out is schematically depicted in FIG. 3, wherein 10' refers to a probe unit of the type shown in FIG. 2. It will be noted that 10' is depicted in greatly simplified fashion, with guide plates, spacers, etc., not shown. Furthermore, for clarity's sake only some of the probe wires are shown.

The fan-out of the probe wires is facilitated by a multiplicity of picture frame-shaped stacked insulator plates 30 (exemplarily ceramic plates) which have successively smaller openings, exemplarily dimensioned such that the dimensions of the largest opening are slightly larger than the outside dimensions of the rectangular array of probe wires, the next smaller opening has length and width slightly smaller than the outermost row and column of the array of probe wires, respectively, but slightly larger than the next to outermost row and column, respectively, with the next smaller and subsequent openings being analogously sized. The thus defined stack of insulator frames makes possible a three-dimensional fan-out, whereby, for instance, only the wires of the two outermost rows and columns of a rectangular probe wire array are brought out on the lowest level, only the wires of the two next smaller rows and columns are brought out on the second lowest level, and so on. It will be obvious that, at least for rows and columns near the center of the array, it may be possible to bring out the wires from more than one set of rows and columns on a given level, due to the decreasing number of wires in a given set of rows and columns, as the distance of the set from the periphery of the array decreases. In FIG. 3 only a small number of wires 31 is shown, however, the figure, together with the above description, will make the arrangement apparent to those skilled in the art.

Exemplarily the fan-out means also comprise a multi-level stack 23' of circuit board 32 or other appropriate stack of insulator plates, which typically comprise means for making electrical contact to the wires 31. These means may be conventional and are therefore not shown. Exemplarily the means comprise plated holes into which the wires are attached. The boards 32 optionally comprise one or more ground planes 33, and de-coupling capacitors or other conventional means may be mounted thereon. It is currently considered advantageous to directly fan out the buckling beam wires 16 (rather than connect the buckling beam wires to separate fan-out conductors), since this reduces the possibility of defective connections. In a currently preferred embodiment the wires are bare, with guide plates and three-dimensional fan-out ensuring electrical separation between the wires.

Figure 4:
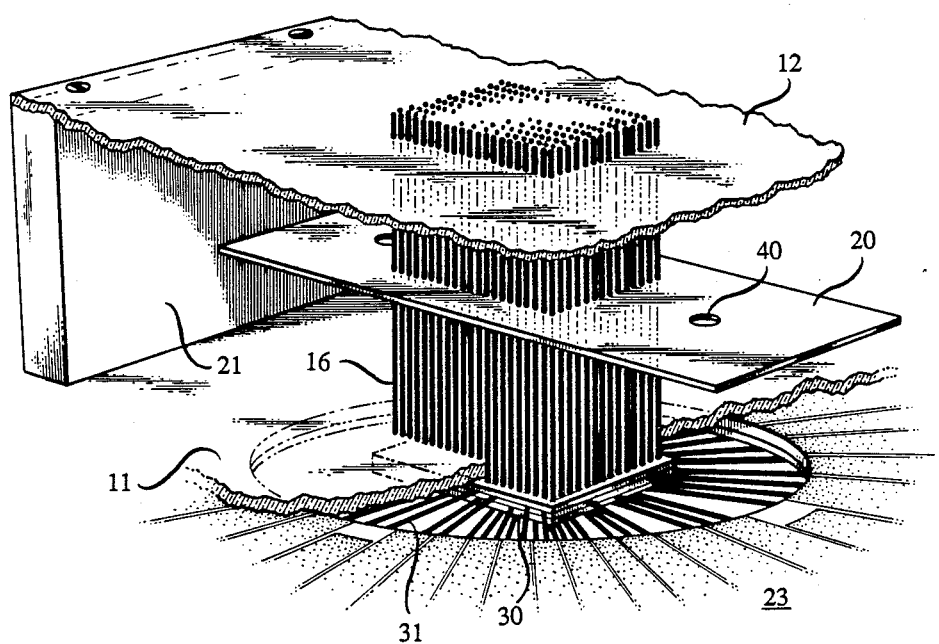
FIG. 4 is a further schematic representation of an exemplary probe assembly.

FIG. 4 is a further schematic representation of a buckling beam unit according to the invention, showing a rectangular array of buckling probe wires 16 maintained in position by fixed guide plates 11 and 12 and floating guide plate 20. The former two guide plates are held spaced apart and in fixed relative position by spacer 21, and guide plate 11 is secured to support plate 23, exemplarily a multi-level PC board. The probe wires are fanned out substantially as described above, with the stack 30 of picture frame-shaped insulator plates facilitating three-dimensional fan out. Apertures 40 in the guide plates make possible direct optical alignment of the probe array with a corresponding array of test points.

It will be understood that all the figures herein are schematic only, and that no attempt is being made to present actual dimensions or proportions.

Figure 5:
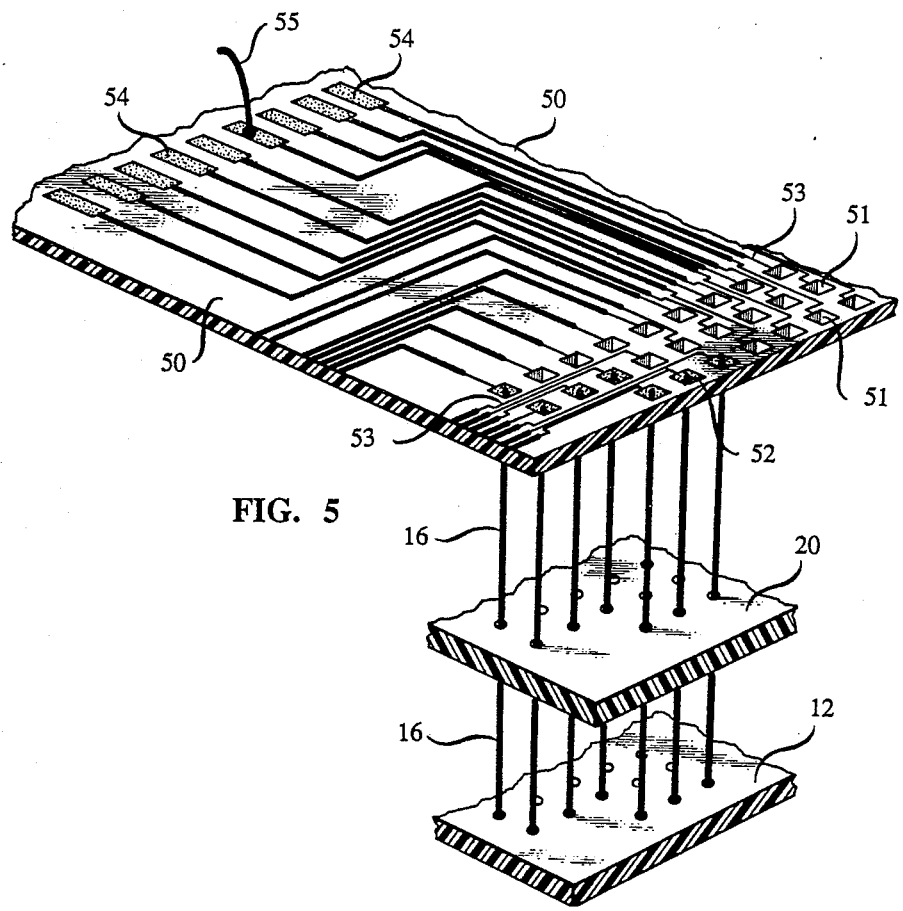
FIG. 5 schematically shows a portion of a Si wafer second guide element.

FIG. 5 schematically depicts a portion of a further probe assembly according to the invention, wherein first and third guide elements 12 and 20, respectively, are substantially as described above, and second guide element 50 is a Si wafer. Through-holes 51 are formed in the wafer by conventional means, e.g., photolithography and anisotropic etching and/or laser drilling, and probe wires 16 extend through the respective through-holes and are soldered in place by a known technique, e.g., solder vapor phase reflow. The second guide element also comprises conductive features 53 which provide electrical connection between any given probe wire and a corresponding connector pad 54. As is well known, present day semiconductor technology permits routine production of very small metal features on a Si surface (including on an oxide or other dielectric layer formed on the surface). It is thus possible to route several conductors through the space between two neighboring through-holes, as is schematically shown in FIG. 5. Exemplarily, the tapered through-holes are 0.2 mm×0.2 mm at the wafer surface (with the two pyramidal etched entrance features connected by a laser-drilled 0.1 mm diameter hole) and are spaced on 0.3 mm centers, and the line width of the narrow portion of the conductors is 0.01 mm. The portion of the conductors that is located outside of the space array of through-holes can be fanned out in any appropriate manner, typically terminating in contact pads. The silicon wafer typically is attached to a circuit board or other appropriate support means, and electrical contact between the contact pads and corresponding conductive features on the support means established, e.g., by means of wire bonds 55 or other known interconnect technology.

Figure 6:
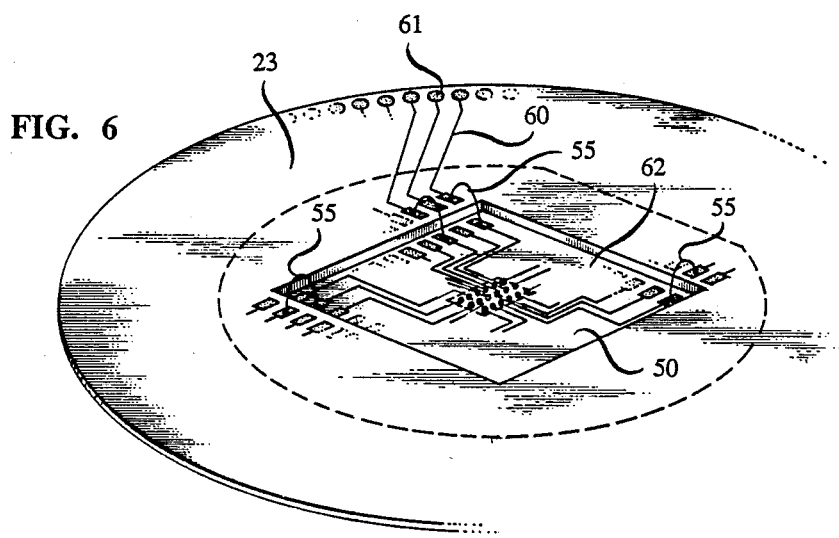

FIG. 6 schematically depicts a portion of apparatus according to the invention, wherein numeral 50 refers to the silicon wafer of a probe assembly as described in connection with FIG. 5, and 23 is a printed circuit board, exemplarily a commercially available board adapted for use with a commercially available testing machine. PC board 23 has an opening 62, which permits establishing electrical connection between conductive features 60 on the PC board and the probe wires of the probe assembly. Exemplarily this connection is made in a known way by means of wire bonding (55). The conductive features 60 typically comprise contact pads 61, whereby contact can be established between the probe wires and the testing electronics. As will be readily understood, PC board 23 may comprise such conventional features as a ground plane, de-coupling capacitors, and the like, which are not shown in the figure.

Although in many cases reliable contact between probe wire and test point results if the probe tip has a flat surface, in some currently preferred embodiments the probe tips are shaped such that the area of contact between probe tip and test point is substantially smaller (typically less than 50%) than the cross section of the probe wire, resulting in substantially increased contact force/unit area. Exemplarily, the probe tip has a shape that resembles a truncated cone or a spherical segment or layer, produced, for instance, by means of an appropriately shaped polishing tool. Such a tool can be produced by, for instance, shaping the tip of a steel "rod" of appropriate diameter (e.g., about 0.2 mm) by known means (e.g., electro-discharge machining using a wedge-shaped tool) such that the tip of the tool assumes the shape of a "crown" with a multiplicity (e.g., four) points or prongs. Contacting a flat probe wire tip with the spinning tool tip such that the tool and the probe wire are essentially coaxial can then result in shaping of the probe tip.

The embodiments described above in detail are exemplary only, and those skilled in the art will be readily able to use the invention to devise other advantageous embodiments.

We claim:

1. Apparatus for electrically testing an electrical circuit comprising an array of test points on an essentially planar substrate, the apparatus comprising a buckling beam probe assembly comprising (a) a first guide element comprising a central portion that contains a multiplicity of through-holes forming an array that corresponds to the array of test points;

(b) a second guide element;

(c) spacer means that serve to maintain the second guide element spaced apart from, and in fixed relationship with, the first guide element, the spacer elements being arranged such that the central portion of the first and of the second guide element is unobstructed by the spacer means;

(d) a multiplicity of buckling beam probe elements, any given probe element attached to the second guide element, extending through one of the holes in the first guide element and a small distance beyond, and being essentially parallel with the other probe elements; and (e) conductor means making electrical contact with at least one of the probe elements; wherein (f) the second guide element comprises a body having a first surface and a second surface substantially parallel to the first surface, the body comprising an array of through-holes that corresponds to the array in the first guide element, the through-holes extending between the first and second surfaces, the probe elements secured to the respective holes in the body, the array of holes in the first guide element being laterally offset with respect to the array in the body, whereby a predetermined buckling direction is imposed on the probe elements; and wherein the means of (e) comprise a multiplicity of conductor lines disposed on the first surface of the body, a given conductor line serving to electrically connect a probe element with a corresponding contact means disposed on the first surface; and wherein (g) the body is a Si body, the Si body is secured to a circuit board comprising conductive features, and a given contact means on the major surface of the Si body is electrically connected to a conductive feature on the circuit board.

2. The apparatus of claim 1, wherein the spacer means are adjustable such that the distance between the first and the second guide means can be decreased by a small predetermined amount while otherwise maintaining the relationship between the first and second guide elements, whereby the resurfacing of worn probe element tips can be facilitated.

3. The apparatus of claim 2, wherein the spacer means comprise removable shims.

4. The apparatus of claim 1, further comprising a third guide element, located between and spaced from, the first and second guide elements, the third guide element also having an array of through-holes that corresponds to the array in the first guide element, with the probe elements extending through the holes in the third guide element, the third guide element being substantially free to move laterally.

5. The apparatus of claim 4, wherein at least the portion of a given probe element that extends from the second guide element to the tip of the probe element is not insulated.

6. The apparatus of claim 1, wherein the tip of at least one probe element is shaped such that the area of contact between the probe element and a test point is substantially smaller than the cross section of the probe element.

* * * * *